United States Patent
Lai et al.

(10) Patent No.: US 9,973,000 B2
(45) Date of Patent: May 15, 2018

(54) ELECTROSTATIC DISCHARGE POWER RAIL CLAMP CIRCUIT

(71) Applicant: NXP B.V., Eindhoven (NL)

(72) Inventors: Da-Wei Lai, Nijmegen (NL); Guido Wouter Willem Quax, Utrecht (NL); Gijs Jan De Raad, Nijmegen (NL)

(73) Assignee: NXP B.V., Eindhoven (NL)

( * ) Notice: Subject to any disclaimer, the term of this patent is extended or adjusted under 35 U.S.C. 154(b) by 246 days.

(21) Appl. No.: 15/172,208

(22) Filed: Jun. 3, 2016

(65) Prior Publication Data

US 2016/0372921 A1 Dec. 22, 2016

(30) Foreign Application Priority Data

Jun. 16, 2015 (EP) .................................... 15172380

(51) Int. Cl.
*H02H 3/22* (2006.01)
*H02H 9/04* (2006.01)
*H01L 27/02* (2006.01)

(52) U.S. Cl.
CPC ......... *H02H 9/046* (2013.01); *H01L 27/0255* (2013.01); *H01L 27/0262* (2013.01); *H01L 27/0266* (2013.01); *H01L 27/0285* (2013.01)

(58) Field of Classification Search
USPC .......................................... 361/59, 91.1, 111
See application file for complete search history.

(56) References Cited

U.S. PATENT DOCUMENTS

| | | | |
|---|---|---|---|
| 8,576,526 B2 | 11/2013 | Chu et al. | |
| 8,885,305 B2* | 11/2014 | Shan | H01L 23/60 361/56 |
| 2002/0130390 A1 | 9/2002 | Ker et al. | |
| 2003/0133237 A1 | 7/2003 | Hung et al. | |
| 2005/0111150 A1 | 5/2005 | Jang et al. | |
| 2006/0087781 A1* | 4/2006 | Ishizuka | H01L 27/0251 361/56 |
| 2008/0179681 A1* | 7/2008 | Kwak | H01L 27/0266 257/358 |

(Continued)

OTHER PUBLICATIONS

Ker et al., "Latchup-Free ESD Protection Design With Complementary Substrate-Triggered SCR Devices," IEEE Journal of Solid-State Circuits, vol. 38, No. 8, Aug. 2003, pp. 1380-1392.

(Continued)

*Primary Examiner* — Danny Nguyen

(57) ABSTRACT

An electrostatic discharge power rail clamp circuit and an integrated circuit including the same. The power rail clamp circuit includes a first power rail, a second power rail and a first node. The circuit further includes an n-channel field effect transistor having a source and drain located in an isolated p-well in a semiconductor substrate. The drain is connected to the first power rail. The source and isolated p-well are connected to the first node. The circuit also includes a capacitor connected between the first node and the second power rail. The circuit further includes a resistor connected between the first power rail and the first node. The circuit also includes an inverter for controlling the gate of the field effect transistor, wherein the inverter has an input connected to the first node. The circuit further a silicon controlled rectifier connected between the first node and the second power rail.

15 Claims, 6 Drawing Sheets

(56) References Cited

U.S. PATENT DOCUMENTS

2011/0110004 A1     5/2011    Maier
2013/0169066 A1*   7/2013    Chen .................. H01L 27/0262
                                                                             307/116
2013/0258533 A1    10/2013    Chen
2014/0160604 A1     6/2014    Lai et al.

OTHER PUBLICATIONS

Smith et al., "A MOSFET Power Supply Clamp with Feedback Enhanced Triggering for ESD Protection in Advanced CMOS Technologies," EOS/ESD Symposium, 2003, 9 pages.

Ker et al., "Investigation and Design of On-Chip Power-Rail ESD Clamp Circuits Without Suffering Latchup-Like Failure During System-Level ESD Test," IEEE Journal of Solid-State Circuits, vol. 43, No. 11, Nov. 2008, pp. 2533-2545.

Ker et al., "New Low-Leakage Power-Rail ESD Clamp Circuit in a 65-nm Low-Voltage CMOS Process," IEEE Transactions on Device and Materials Reliability, vol. 11, No. 3, Sep. 2011, pp. 474-483.

Ker et al., "On the Design of Power-Rail ESD Clamp Circuits With Gate Leakage Consideration in Nanoscale CMOS Technology," IEEE Transactions on Device and Materials Reliability, vol. 14, No. 1, Mar. 2014, pp. 536-544.

Altolaguirre et al., "Area-Efficient ESD Clamp Circuit with Capacitance-Boosting Technique to Minimize Standby Leakage Current," IEEE Transactions on Device and Materials Reliability, future publication, 6 pages.

Chen et al., "Area-Efficient ESD-Transient Detection Circuit With Smaller Capacitance for On-Chip Power-Rail ESD Protection in CMOS ICs," IEEE Transactions on Circuits and Systems—II: Express Briefs, vol. 56, No. 5, May 2009, pp. 359-363.

\* cited by examiner

ELECTROSTATIC DISCHARGE POWER RAIL CLAMP CIRCUIT

CROSS-REFERENCE TO RELATED APPLICATIONS

This application claims priority under 35 U.S.C. § 119 to European patent application no. EP15172380.6, filed Jun. 16, 2015, the contents of which are incorporated by reference herein.

FIELD OF THE INVENTION

This invention relates to an electrostatic discharge power rail clamp circuit and to an integrated circuit including an electrostatic discharge power rail clamp circuit.

BACKGROUND OF THE INVENTION

Conventional RC-based electrostatic discharge (ESD) power rail clamp circuits are often used in whole-chip ESD protection schemes in complementary metal oxide semiconductor integrated circuits, owing to their fast turn-on and superior ESD performance characteristics.

ESD power rail clamp circuits of this kind typically include one or more resistors and capacitors in an RC network for determining a time constant of the circuit. The components forming the RC network can occupy a significant amount of space in the integrated circuit.

Additionally, circuits of this kind typically use a large field effect transistor (big-FET) for shunting the ESD current to ground. This large field effect transistor typically may have a large standby leakage current and a large gate leakage of the capacitor.

Furthermore, circuits of this kind may be prone to latch-up failures during testing.

SUMMARY OF THE INVENTION

Aspects of the invention are set out in the accompanying independent and dependent claims. Combinations of features from the dependent claims may be combined with features of the independent claims as appropriate and not merely as explicitly set out in the claims.

According to an aspect of the invention, there is provided an electrostatic discharge (ESD) power rail clamp circuit comprising:
  a first power rail;
  a second power rail;
  a first node;
  an n-channel field effect transistor comprising a source and drain located in an isolated p-well in a semiconductor substrate, wherein the drain is connected to the first power rail and wherein the source and the isolated p-well are connected to the first node; a capacitor connected between the first node and the second power rail;
  a resistor connected between the first power rail and the first node;
  an inverter for controlling the gate of the field effect transistor, wherein the inverter has an input connected to the first node; and
  a silicon controlled rectifier (SCR) connected between the first node and the second power rail for discharging an ESD current flowing through the field effect transistor to the second power rail.

A voltage at the first node may be used to control the voltage of the source and the isolated p-well for improving the performance of the circuit. For instance, the voltage at the first node may be used to set the voltage at the source and the isolated p-well to a certain level (e.g. the same voltage as the drain, which is connected to the first power rail) during normal operation for reducing the standby leakage of the n-channel field effect transistor. During an ESD event, the voltage at the first node may be used to set the voltage at the source and the isolated p-well to another level (e.g. the voltage at the second power rail), so that the n-channel field effect transistor can shunt the ESD current.

The capacitor may act to block leakage current from the n-channel field effect transistor, which may reduce the standby leakage of the circuit. Although some leakage current may still pass through the silicon controlled rectifier, silicon controlled rectifiers generally have low leakage. The combination of the capacitor and resistor may also determine a time constant of the circuit.

The provision of a silicon controlled rectifier for discharging an ESD current flowing through the field effect transistor to the second power rail may improve the performance of the circuit in terms of reduced standby leakage and latch up immunity.

Embodiments of this disclosure may find particular application for high voltage (HC) rail clamp circuits (>7V for the purposes of this disclosure). In conventional ESD HV power rail clamp circuits, a large field effect transistor needs to be used (in view of the high voltages between the power rail and ground), which occupies a large area. In contrast, embodiments of this invention may use a relatively small n-channel field effect transistor (because of the arrangement of the capacitor and silicon controlled rectifier, the voltage drop across the n-channel field effect transistor is relatively small. This may a substantial reduction in the overall size of the clamp.

The isolated p-well of the n-channel field effect transistor may be isolated by one or more n-type regions in the semiconductor substrate. The one or more n-type regions may include one or more n-wells. The n-wells may, for instance include a well formed around a periphery of the isolated p-well. The n-wells may include an n-well layer located beneath the isolated p-well in the semiconductor substrate. The one or more n-type regions may be connected to the first power rail, for isolating the p-well.

The circuit may include a diode string. For instance, the diode string may include a plurality of diodes connected between an output of the inverter and the first node. This can lift the gate of the n-channel field effect transistor with respect to the node during an ESD event and can lead to additional current shunting capability.

In another example a diode string may include a plurality of diodes connected in series between the capacitor and the second power rail. This may reduce gate-leakage in the circuit induced by the capacitor. In one embodiment, an output of the silicon controlled rectifier may be connected to a node of the circuit that is located between the capacitor and an input of the diode string. This may assist in preventing latch up of the circuit during testing by increasing the holding voltage of the silicon controlled rectifier.

In one embodiment, an output of the inverter may be connected to the gate of the n-channel field effect transistor.

In one embodiment, the inverter may be connected in series with a plurality of further inverters to form a chain of inverters. An output of the chain of inverters may be connected to the gate of the n-channel field effect transistor. Control lines may be provided between the outputs of at least some of the inverters in the chain of inverters and the silicon controlled rectifier.

The circuit may include a feedback stage for latching in a state of the gate of the n-channel field effect transistor during an electrostatic discharge event. This can allow the RC components of the circuit to be freed from the holding operation of the circuit after triggering (which is performed instead by the feedback circuit). Because of this, the RC components can be chosen specifically for the purpose of ESD event detection (triggering), and thus can be made smaller, so that they occupy less space on, for example, an integrated circuit incorporating the ESD power rail clamp circuit.

The feedback stage may include a p-channel field effect transistor and an n-channel field effect transistor connected in series between the first power rail and the second power rail. The gate of the n-channel field effect transistor may be connected to the gates of the p-channel field effect transistor and the n-channel field effect transistor of the feedback stage.

The feedback stage may have an output for controlling the gate of the n-channel field effect transistor. In one example, the output of the feedback stage may be connected to the input of the inverter. In another example, the output of the feedback stage may be connected to the input of one of the inverters of the chain of inverters mentioned above (e.g. to the input of the inverter in the chain of inverters that is closest to the gate of the n-channel field effect transistor.

During normal operation of the circuit, the drain, source and isolated p-well of the n-channel field effect transistor may all be held at substantially the same voltage, wherein the voltage is the voltage of the first power rail. This may reduce standby leakage of the circuit.

During an electrostatic discharge event, the capacitor may be operable to pass an electrostatic discharge current to the second power rail. Since ESD events are typically high frequency events, the capacitor may effectively short the path between the first node and the second power rail, to allow the ESD current to be discharged. This can pull the voltage at the first node down to the voltage on the second power rail.

The second power rail may for instance be a ground rail.

According to another aspect of the invention, there is provided an integrated circuit including an electrostatic discharge (ESD) power rail clamp circuit of the kind described above.

BRIEF DESCRIPTION OF THE DRAWINGS

Embodiments of the present disclosure will be described hereinafter, by way of example only, with reference to the accompanying drawings in which like reference signs relate to like elements and in which.

DETAILED DESCRIPTION

Embodiments of the present disclosure are described in the following with reference to the accompanying drawings.

Embodiments of this disclosure can provide an electrostatic discharge (ESD) power rail clamp circuit. The circuit includes a first power rail and a second power rail. The ESD power rail clamp circuit may be operable to shunt an ESD current from the first power rail to the second power rail.

An electrostatic discharge power rail clamp circuit according to an embodiment of this disclosure may have a low standby leakage current. Also, the RC components of the circuit may be relatively small, so that they occupy a relatively small area on, for example, an integrated circuit incorporating the ESD power rail clamp circuit. Moreover, embodiments of this disclosure may provide an electrostatic discharge power rail clamp circuit that is less prone to latch up during testing.

Figure 1:
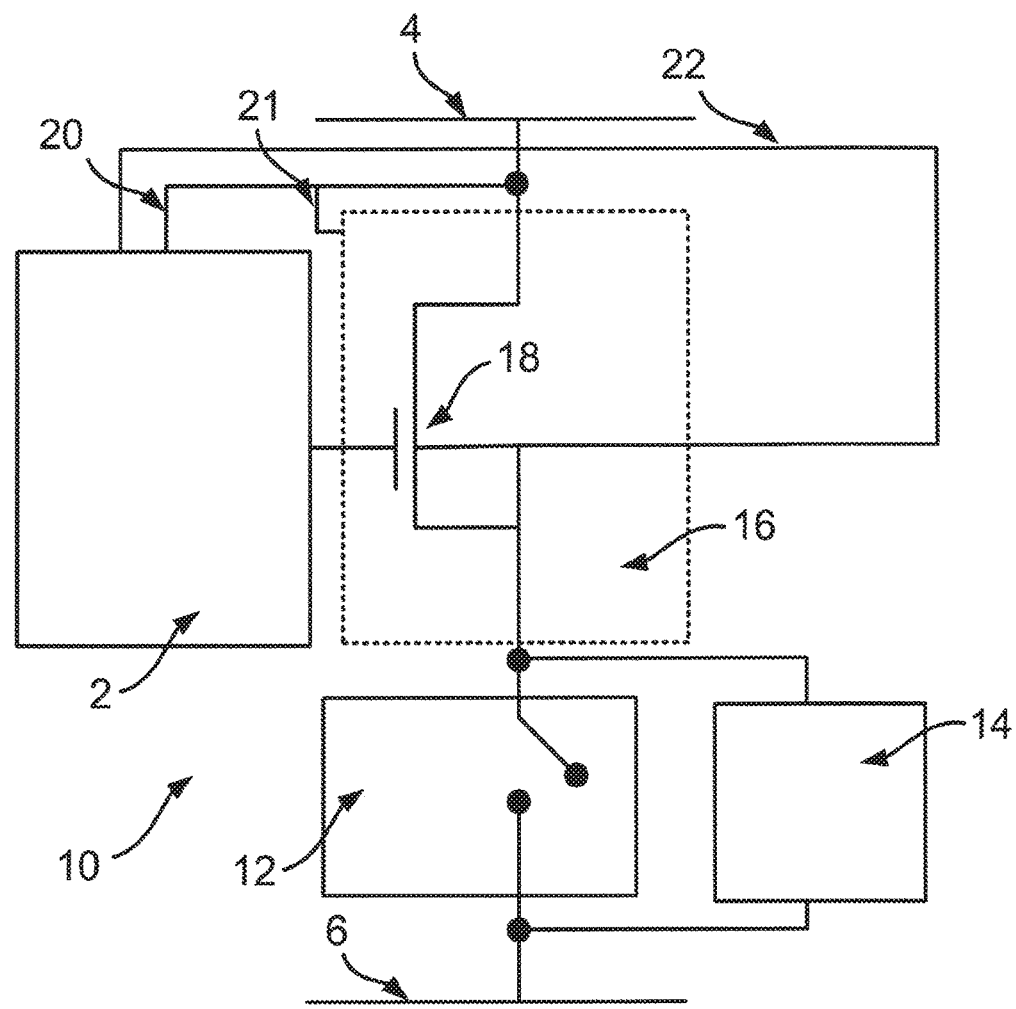
FIG. 1 shows an electrostatic discharge power rail clamp circuit in accordance with an embodiment of the present disclosure.

FIG. 1 shows an electrostatic discharge power rail clamp circuit 10 in accordance with a first embodiment of this disclosure. The circuit 10 shown in FIG. 1 includes a first power rail 4 and a second power rail 6. The first power rail 4 may, for instance, provide a supply voltage for a device such as an integrated circuit incorporating the ESD power rail clamp circuit. The second power rail 6 may, for example, be a ground rail. Each of the power rails 4, 6 may be connected to input/output pins of an integrated circuit incorporating the circuit 10.

The circuit 10 includes an n-channel field effect transistor 18. The field effect transistor 18 is connected between the first power rail 4 and the second power rail 6. During an ESD event, the field effect transistor 18 may be operable to shunt an ESD current from the first power rail 4 to the second power rail 6. The circuit 10 also includes a second ESD device 14, which comprises a silicon controlled rectifier. The second ESD device 14 may be operable to pass an ESD current flowing through the field effect transistor 18 to the second power rail 6.

The circuit 10 further includes a switch 12 comprising a capacitor. The switch 12, may be open during normal operation of the device (i.e. in the absence of an ESD event) and may be closed during an ESD event. As will be described in more detail below, when an ESD event occurs, the discharge current may initially be shunted through the field effect transistor 18 to the second power rail 6 via the capacitor of the switch 12. Note that the capacitor is effectively closed circuit on the timescales associated with detection of an ESD event (typically a nanoseconds). However, after a certain period of time, the voltage across the capacitor of the switch 12 may trigger the silicon controlled rectifier of the second ESD device 14. Thereafter, the ESD current flowing through the field effect transistor 18 may be shunted to the second power rail 6 via the second ESD device 14.

The arrangement of the switch 12, connected in series with the field effect transistor 18 between the first power rail 4 and the second power rail 6 can, in standby mode, reduce leakage currents passing through the field effect transistor 18. During normal operation, the capacitor of the switch 12 is effectively open circuit, due substantially non-varying voltage applied across its terminals.

The circuit also includes an RC timer 2. The RC timer 2 can include one or more resistors and capacitors for determining a time constant of the ESD power rail clamp circuit 10. The RC timer 2 may be connected to a gate of the field effect transistor 18 for applying a control signal for turning the field effect transistor 18 on during an ESD event to allow the ESD current to be shunted to the second power rail 4. The RC timer 2 may also be connected to the first power rail 4 for detecting an ESD event on the first power rail 4.

In this embodiment, the field effect transistor 18 is provided on a semiconductor substrate. The substrate may, for example, be a silicon substrate. As will be described in more detail below in relation to FIG. 4, the field effect transistor 18 may be an n-channel field effect transistor that includes an isolated p-well in which n-type regions form the source and drain. The isolated p-well may be isolated by an n-well 16 (illustrated schematically in FIG. 1) located in the substrate. The n-well 16 may be connected to the first power rail 4 (as represented by the connection 21 in FIG. 1).

The RC timer 2 may also be connected to the source and to the isolated p-well of the field effect transistor 18 (represented by the connection 22 in FIG. 1). This can allow the source and the isolated p-well of the field effect transistor 18 to be held at an appropriate voltage during normal operation and during an ESD event for improving the performance of the circuit 10. For instance, during normal operation, the RC timer 2 can apply a voltage to the isolated p-well and source of the field effect transistor substantially equal to the voltage on the first power rail 4. Accordingly, since the drain, n-well 16, source and isolated p-well of the field effect transistor 18 may all be held at the same voltage (namely the voltage on the first power rail 4), no leakage (or only a relatively small amount of leakage) would flow from the field effect transistor 18. On the other hand, during an ESD event, the RC timer 2 may apply a different voltage to the source and isolated p-well of the field effect transistor 18. In particular, the source and isolated p-well of the field effect transistor 18 can be pulled down to the voltage on the second power rail 6 (for instance, ground), so that the field effect transistor 18 can conduct the ESD current.

The various functional components of an electrostatic discharge power rail clamp circuit have been described above in relation to FIG. 1. In the following, a number of example circuits will be described in more detail.

Figure 2:
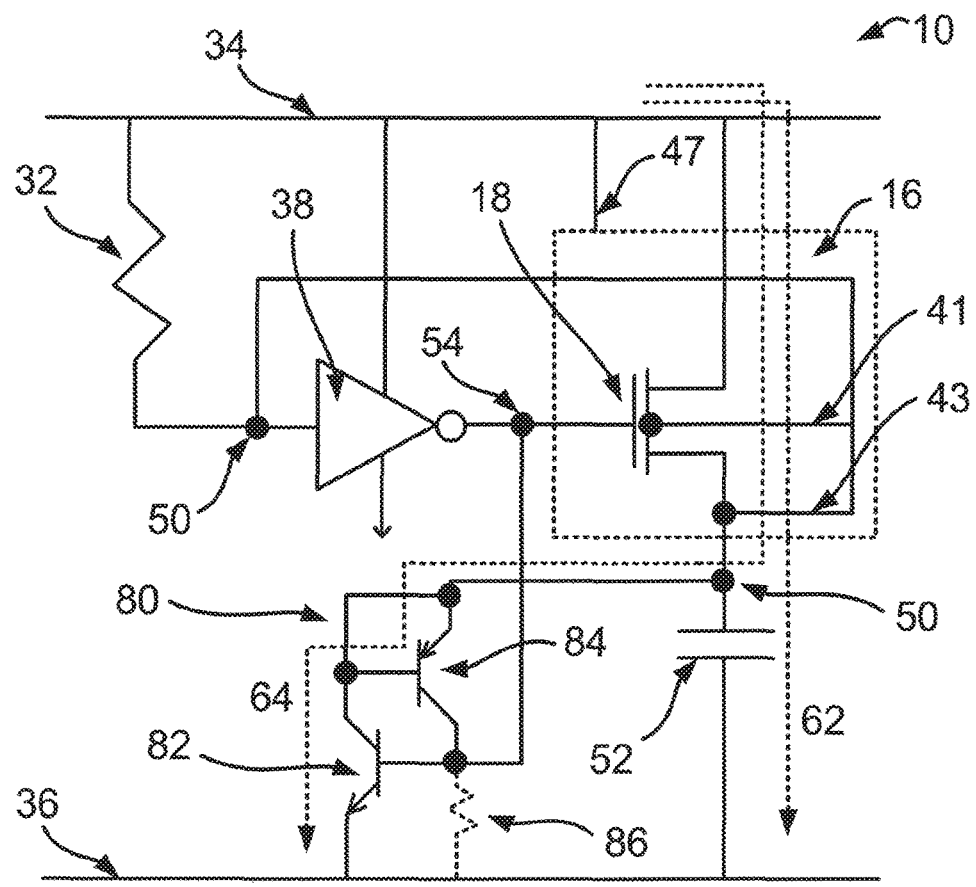
FIG. 2 shows an electrostatic discharge power rail clamp circuit in accordance with another embodiment of the present disclosure.

FIG. 2 shows an electrostatic discharge power rail clamp circuit 10 in accordance with a second embodiment of this disclosure. The circuit 10 includes a first power rail 34 and a second power rail 36. The circuit 10 includes a field effect transistor 18. The field effect transistor 18 is an n-channel field effect transistor, which is connected between the first power rail 34 and the second power rail 26 for shunting an ESD current from the first power rail 34 to the second power rail 36 during an ESD event. The drain of the field effect transistor 18 is connected to the first power rail 34. The source of the field effect transistor 18 is connected to a first node 50 of the circuit 10. Note that in FIG. 2 and also in each of the circuit diagrams in the subsequent figures, the first node 50 is shown in two separate locations for reasons of clarity. Although each circuit diagram shows two nodes labelled node 50, these are in fact the same node in the circuit 10.

As described above, the field effect transistor 18 has a source and a drain that are located in an isolated p-well in a semiconductor substrate. The source and the isolated p-well are connected to the first node 50 as represented by the connections 41, 43 shown in FIG. 2. The isolated p-well of the field effect transistor 18 in this example is isolated by an n-well 16, which is shown schematically in FIG. 2. The n-well 16 of the field effect transistor 18 is connected to the first power rail 34, as shown schematically by the connection 47, so that the n-well 16 is held at the voltage of the first power rail 34.

As shown in FIG. 2, in this example the circuit 10 also includes a capacitor 52. The capacitor 52 is connected between the first node 50 and the second power rail 36. As will be described in more detail below, the capacitor 52 can act as a switch to block leakage currents during normal operation while allowing an ESD current to be shunted to the second power rail 36 during an ESD event.

The circuit 10 also includes a silicon controlled rectifier 80. The silicon controlled rectifier includes two bipolar transistors. In particular, the silicon controlled rectifier 80 includes a first PNP bipolar transistor 84 and a first NPN bipolar transistor 82 as is known in the art. Resistor 86 represents the resistance $R_{sub}$ of the silicon controlled rectifier 80. As shown in FIG. 2, an input of the silicon controlled rectifier 80 is connected to the first node 50 and an output of the silicon controlled rectifier 80 is connected to the second power rail 36. As will be explained below, once the silicon controlled rectifier 80 has been triggered, this can allow an ESD current flowing through the field effect transistor 18 to be shunted on to the second power rail 36 through the silicon controlled rectifier 80.

The circuit 10 further includes an inverter 38. The power terminals of the inverter 38 may be connected to the first power rail 34 and the second power rail 36. An output of the inverter 38 can be used to control the gate of the field effect transistor 18. In the present example, the output of the inverter 38 is connected directly to the gate of the field effect transistor 18 to apply a control signal to the gate for switching the field effect transistor 18 on during an ESD event and for keeping the field effect transistor 18 switched off during normal operation. As shown in FIG. 2, the output of the inverter 38 may also be connected to the silicon controller rectifier 80 via a node 54 for applying a control signal to the silicon controlled rectifier 80 for triggering it during an ESD event.

As also shown in FIG. 2, an input of the inverter 38 is connected to the first node 50. Accordingly, the voltage signal at the first node 50 can be used to control the gate of the field effect transistor 18 via the inverter 38. When the voltage at the first node 50 is high (for instance during normal operation of the device) the inverter outputs a low voltage to apply to the gate of the field effect transistor 18 so that the field effect transistor 18 is switched off. However, as will be explained below, during an ESD event, the voltage at the first node 50 is pulled low, so that the inverter 38 applies a high voltage to the gate of the field effect transistor 18 to turn the field effect transistor 18 on for shunting the ESD current.

In one example, the inverter 38 may be unbalanced in the sense that it may include a PMOS transistor and an NMOS transistor where the PMOS transistor is (substantially) larger than the NMOS transistor. A resistor may be added between the node 54 and the drain of the NMOS of the inverter 38.

This can allow the discharge time of the gate of the field effect transistor 18 to be tuned.

FIG. 2 further shows that the circuit 10 includes a resistor 32. The first node 50 is connected to the first power rail 34 via the resistor 32. The values of the resistor 32 and the capacitor 50 may be chosen to determine an RC time constant of the circuit 10.

Having described the various components of the circuit 10 shown in FIG. 2, the operation of the circuit 10 during normal operation and during an ESD event will now be explained.

During normal operation (in the absence of an ESD event) the voltage at the first node 50, which is connected to the first power rail 34 through the resistor 32, is high and substantially constant. Because the voltage at the first node 50 is substantially constant, the capacitor 52 blocks any (DC) current flowing from the first node to the second power rail 36. Also, because the voltage at the first node 50 is high, the voltage applied to the gate of the field effect transistor 18 by the inverter 38 is low, so that the field effect transistor 18 is switched off. This may prevent current flowing through the field effect transistor 18 during normal operation. The silicon controlled rectifier 80 is also switched off.

Furthermore, since the voltage at the first node 50 is high, the isolated p-well and the source of the field effect transistor 18, which are both connected to the first node 50 as explained above, are held at substantially the same voltage as the drain and the n-well 16 of the field effect transistor. Because the source, drain, isolated p-well and the n-well 16 of the field effect transistor 18 are all held at the voltage of the first power rail 34, any leakage currents passing through the field effect transistor 18 would be small. In any case, leakage currents passing through the field effect transistor 18 would be blocked from reaching the second power rail 36 by the capacitor 52 as noted above.

It is possible that a small leakage current may still reach the second power rail 36 through the silicon controlled rectifier 80, however silicon controlled rectifiers generally are known to have low leakage. It is possible that a leakage current from the n-well 16 of the field effect transistor 18 may pass to the first power rail 34. Again though, it is envisaged that any such current would be small.

Accordingly, during normal operation, the circuit of FIG. 2 has low standby leakage. Typically, it may be desired that the field effect transistor 18 would be a relatively large field effect transistor to improve the ESD robustness of the circuit 10. Accordingly, embodiments of this disclosure can allow a relatively large field effect transistor to be used to shunt ESD currents without incurring large standby leakages.

During an ESD event, the voltage at the first node 50 is be pulled low. This is because the capacitor 52 would, on the short timescales associated with ESD events, effectively short the first node 50 to the second power rail 36 (which may, for example, be a ground rail). Since the voltage at the first node 50 is pulled low, the signal applied to the gate of the field effect transistor 18 by the inverter 38 is pulled high, so that the field effect transistor 18 is switched on. The field effect transistor 18 may initially shunt the ESD current from the first power rail 34 to the second power rail 36 via the capacitor 52. This current path is represented by the dotted line labelled 62 in FIG. 2.

Subsequently, the potential across the capacitor 52 triggers the silicon controlled rectifier 80 (note that triggering of the silicon controlled rectifier depends not only on the potential across the capacitor 52 but also on the active triggering of the silicon controlled rectifier from node 54). Thereafter, the ESD current passing through the field effect transistor 18 is shunted through the silicon controlled rectifier 80. This current path is represented by the dotted line labelled 64 in FIG. 2. Note that the substrate of the silicon controlled rectifier 80 is, as explained above, connected to the node 54 and as such has the same voltage as the gate of the field effect transistor 18. This can allow the silicon controlled rectifier 80 to be activated quickly during an ESD event since the substrate of the silicon controlled rectifier 80 is driven to a high potential state during the ESD event. Accordingly, during an ESD event, although the ESD current may initially be shunted through the capacitor 52 to the second power rail 36, the silicon controlled rectifier 80 may be activated relatively quickly to divert the current through the silicon controlled rectifier 80, thereby improving the performance characteristics of the circuit 10.

Since the ESD current during an ESD event is not solely conducted by the channel mode of the field effect transistor 18, in contrast to a traditional RC-based power rail ESD clamp circuit, the RC time constant of the circuit can be designed with a relatively small value. As a result, the RC components themselves (for example, the resistor 32 and the capacitor 52) can be made relatively small. Therefore the area required for such components can be correspondingly small. The amount of space occupied by the circuit 10 (e.g. on a substrate of an integrated circuit) may thereby be reduced.

As is known in the art of ESD protection, silicon controlled rectifiers have a relatively high triggering current. Accordingly, the provision of the silicon controlled rectifier 80 in the circuit 10 of FIG. 2 can also act to prevent latch up failures during testing of the circuit 10.

In one example, a string of diodes may be provided between the node 54 and the node 50. This can lift the gate of the field effect transistor 18 further with regard to the node 50 during an ESD event and can lead to additional current shunting capability.

Figure 3:
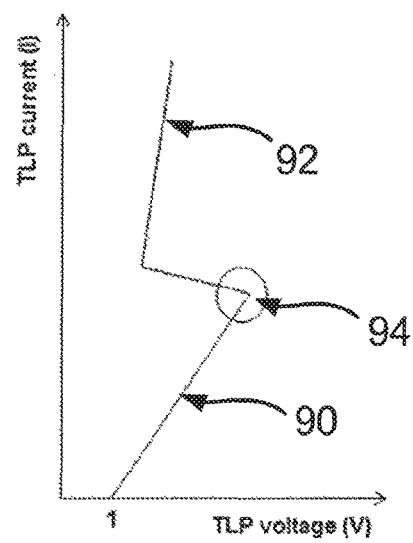
FIG. 3 shows a transmission line pulse (TLP) plot for the electrostatic discharge power rail clamp circuit shown in FIG. 2.

FIG. 3 shows a transmission line pulse (TLP) for a circuit 10 of the kind shown in FIG. 2. The portion 90 of the plot in FIG. 3 corresponds to the current path 62 explained above. The point 94 shown in FIG. 3 corresponds to the trigger current (It1) of the silicon controlled rectifier 80. At It1, snapback occurs as the silicon controlled rectifier 80 is triggered. Thereafter, the portion 92 of the plot in FIG. 3 corresponds to the path 64 shown in FIG. 2.

Figure 4:
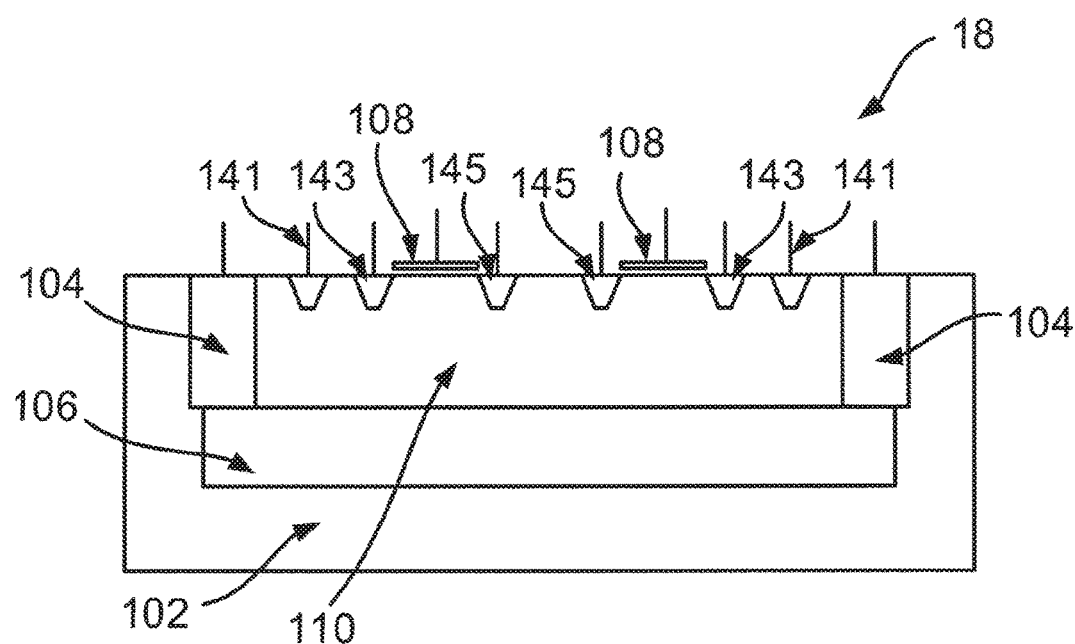
FIG. 4 shows a cross section of a field effect transistor of the kind that may be included in an electrostatic discharge power rail clamp circuit in accordance with an embodiment of the present disclosure.

FIG. 4 shows a cross-section of a field effect transistor 18 of the kind that may be incorporated into an ESD power rail clamp circuit in accordance with an embodiment of this disclosure.

The field effect transistor 18 is an n-channel field effect transistor. The field effect transistor 18 may be provided in a p-type substrate 102. The field effect transistor 18 may include an isolated p-well 110. The isolated p-well 110 may be isolated by one or more n-wells 104, 106. The n-wells may, for example, comprise relatively shallow wells 104 and/or an deep n-well layer 106. The n-wells 104 may be provided at a periphery of the isolated p-well 110. The deep n-well layer 106 may be located beneath the isolated p-well 110. As described above, the n-wells may be connected to the first power rail of the circuit so that they may be held at the voltage of the first power rail.

The field effect transistor 18 may include connections 141 for connecting the isolated p-well 110 to the first node of the circuit as described above.

The field effect transistor 18 can also include a source including one or more source regions 143, which as noted above may be connected to the first node of the circuit. The field effect transistor 18 can further include one or more drain regions 145, which as described above may be connected to the first power rail of the circuit. The field effect transistor 18 may further include a gate 108.

Figure 5:
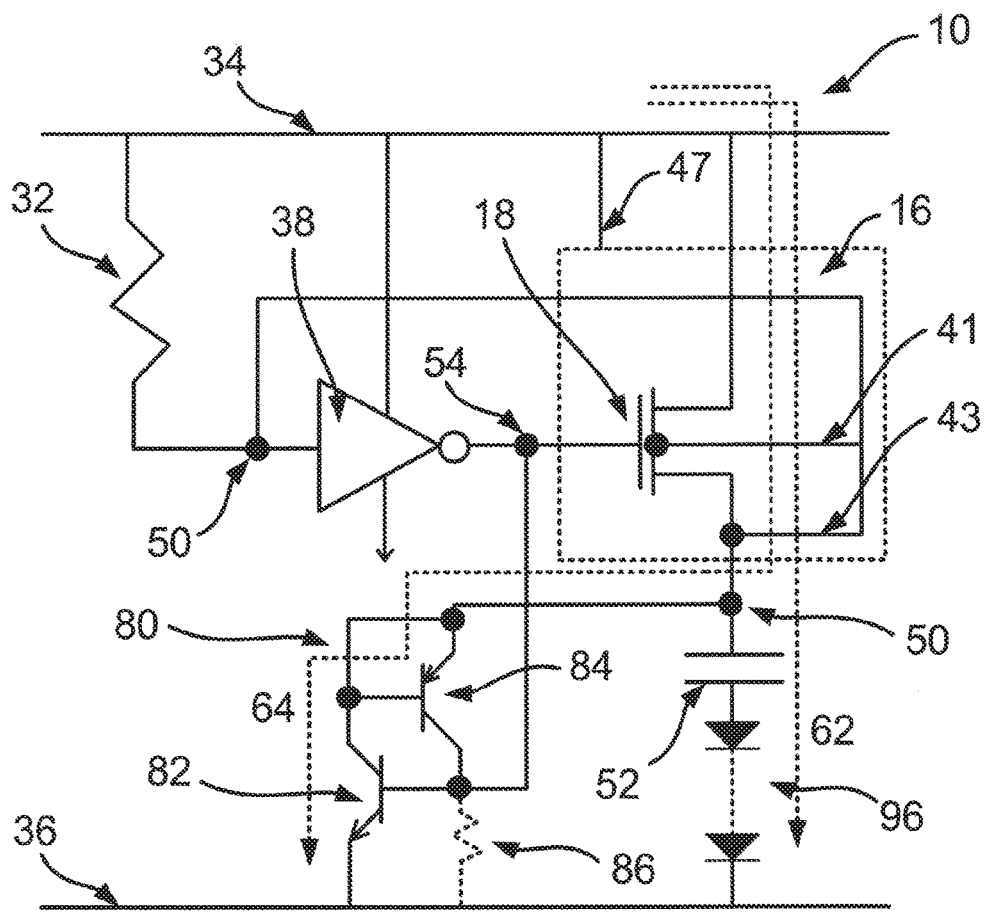
FIG. 5 shows an electrostatic discharge power rail clamp circuit in accordance with a further embodiment of the present disclosure.

FIG. 5 shows an electrostatic discharge power rail clamp circuit 10 in accordance with another embodiment of this disclosure. As can be seen from FIG. 5, the circuit 10 in this example is similar in many respects to the circuit described above in relation to FIG. 2. Only the differences between the circuit shown in FIG. 5 and the circuit shown in FIG. 2 will be described here.

The circuit 10 in this example is includes a diode string 96. The diode string 96 includes a plurality of diodes that are connected in series between the capacitor 52 and the second power rail 36. As described above, during normal operation (i.e. when no ESD event taking place) the capacitor 52 may act to block a leakage current reaching the second power rail 36. The diode string 96 can allow a further inhibit any leakage passing through the capacitor 52 to the second power rail 36. The standby leakage of the circuit 10 can thereby be further reduced.

Figure 6:
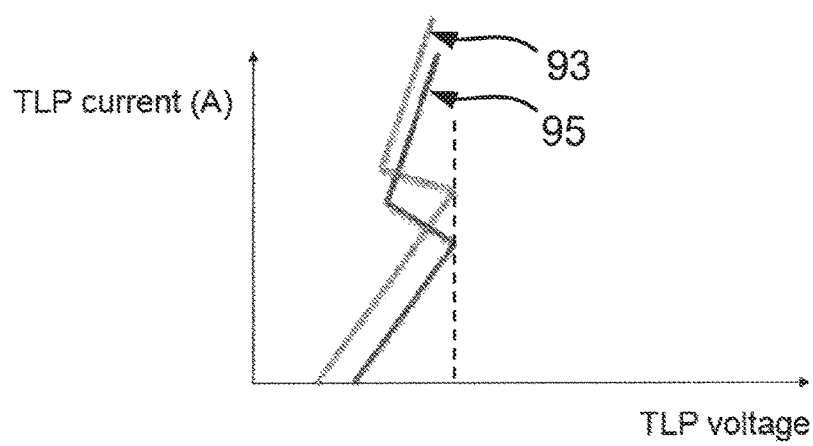
FIG. 6 shows a transmission line pulse (TLP) plot for the electrostatic discharge power rail clamp circuit shown in FIG. 5.

FIG. 6 shows a TLP plot for the circuit of FIG. 5. In FIG. 6, the line 93 corresponds to the plot shown previously in FIG. 3 for the circuit of FIG. 2. The plot 95 in FIG. 6 corresponds to the circuit in FIG. 5. As can be seen, the effect of the provision of the diode string 96 in the circuit of FIG. 5 is to shift the part of the TLP plot corresponding to the path 62 to the right. In common with the plot 93 and with the circuit shown in FIG. 2, once the trigger voltage of the silicon controlled rectifier 80 is reached (and the voltage from node 54 is also suitable for triggering the silicon controlled rectifier 80), snapback occurs and current is diverted through path 64.

Figure 7:
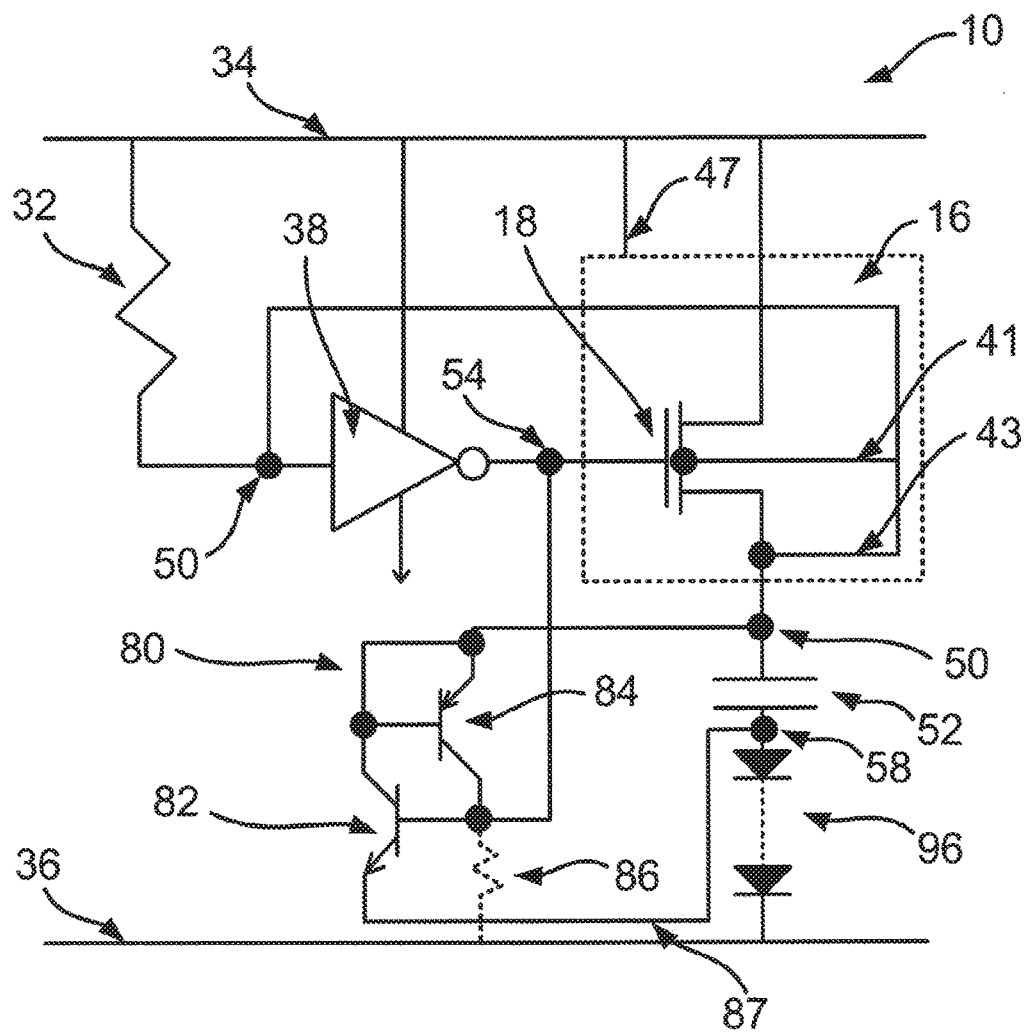
FIG. 7 shows an electrostatic discharge power rail clamp circuit in accordance with another embodiment of the present disclosure.

FIG. 7 shows an electrostatic discharge power rail clamp circuit 10 according to another embodiment of this disclosure. The circuit 10 shown in FIG. 7 is similar in many respects to the circuit shown in FIG. 5 and only the differences between the two circuits will be explained here. The circuit 10 in FIG. 7 also includes a diode string 96 connected between the capacitor 52 and the second power rail 36. However, in this example, an output of the silicon controlled rectifier 80 is connected to a node 58 located between the capacitor 52 and the diode string 96, instead of being connected directly to the second power rail 36 as shown in FIG. 5. The arrangement shown in FIG. 7 may increase the holding voltage of the silicon controlled rectifier 80, which may improve the ability of the circuit 10 to avoid latch up during testing.

Figure 8:
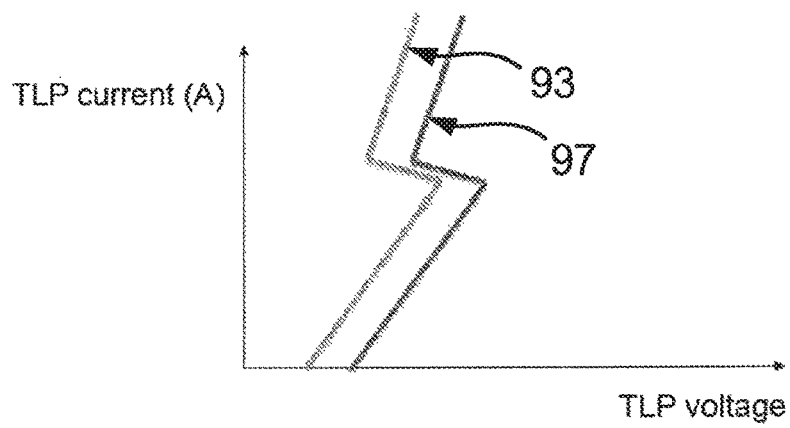
FIG. 8 shows a transmission line pulse (TLP) plot for the electrostatic discharge power rail clamp circuit shown in FIG. 7.

FIG. 8 shows a transmission line pulse (TLP) plot that compares the line shape shown in FIG. 3 for the circuit of FIG. 2 with the line shape associated with the circuit 10 of FIG. 7. In particular, in FIG. 8, the plot 93 corresponds to the circuit of FIG. 2, while the plot 97 corresponds to the circuit in FIG. 7. As is shown by FIG. 8, the arrangement of the diode string 96 and the alternative connection of the output of the silicon controlled rectifier 80 shifts the entire TLP plot to the right for the circuit 10 of FIG. 7. The holding voltage of the circuit including the silicon controlled rectifier 80 is thereby increased as noted above.

Figure 9:
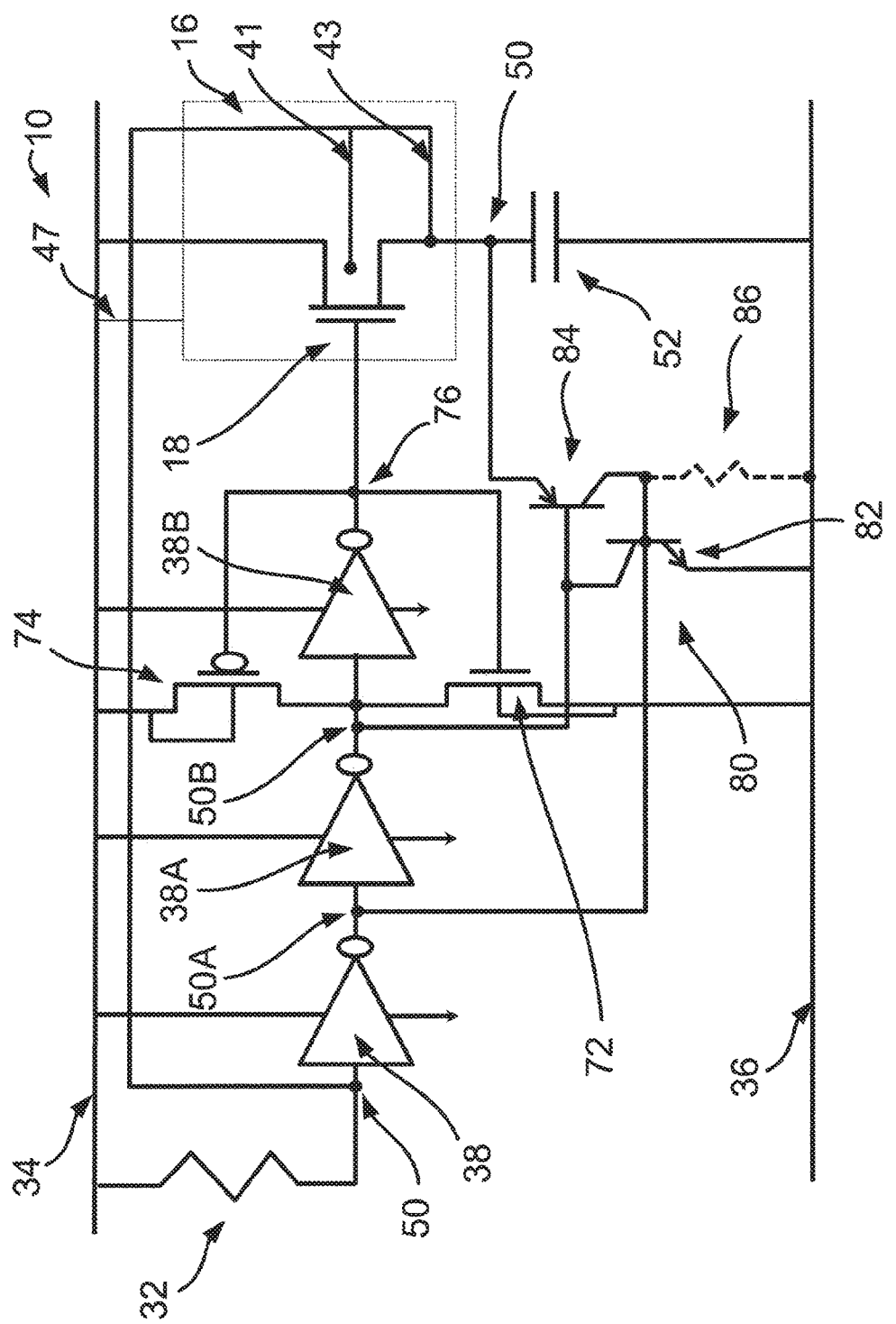
FIG. 9 shows an electrostatic discharge power rail clamp circuit in accordance with a further embodiment of the present disclosure.

FIG. 9 shows an electrostatic discharge power rail clamp circuit 10 according to another embodiment of this disclosure. The circuit 10 in this example is similar in many respects to the circuits described above. Only the main differences between the circuit of FIG. 9 and, for example, the circuit of FIG. 2 will be described here.

In this embodiment, the output of the silicon controlled rectifier 80 is connected directly to the second power rail 36 as explained above in relation to FIG. 2 and the circuit 10 does not include a diode string of the kind described in relation to FIGS. 5 and 7. However, it is envisaged that the alternative connection of the output of the silicon controlled rectifier 80 shown in FIG. 7 and/or the diode string shown in FIGS. 5 and 7 may also be used in the example of FIG. 9.

The circuit in FIG. 9 differs from the circuit 10 shown in FIG. 2 in two main ways. Firstly, the circuit in FIG. 9 includes a chain of inverters including an inverter 38 and two further inverters 38A, 38B. The inverters are connected in series and an output of the chain of inverters may be connected to the gate of the field effect transistor 18 for controlling the field effect transistor 18 to switch it on in an ESD event and to keep it switched off during normal operation. An input of the chain of inverters is connected to the first node 50. The power supply inputs of each inverter 28, 38A, 38B in the inverter chain may be connected to the first power rail 34 and the second power rail 36.

The provision of the chain of inverters shown in FIG. 9 may speed up the turn-on of the silicon controlled rectifier 80 using a double triggered approach. In particular, a p-well and an n-well of the silicon controlled rectifier 80 may be connected to node 50A and node 50B of the circuit, respectively. During normal operation, as explained above already in relation to FIG. 2, the voltage at the first node 50 is high, so that the voltage at node 50A is low and the voltage at node 50B is high. Accordingly, during normal operation the voltage applied to the p-well of the silicon controlled rectifier 80 is low and the voltage applied to the n-well of the silicon controlled rectifier 80 is high. However, during an ESD event, when the voltage at the node 50 is pulled low, the voltage at node 50A goes high and the voltage at node 50B goes low. Accordingly, voltage at the p-well of the silicon controlled rectifier 80 during an ESD event goes high and the voltage at the n-well of the silicon controlled rectifier 80 during an ESD event goes low. This arrangement can speed up the triggering of the silicon controlled rectifier 80 because both bipolar transistors 82, 84 of the silicon controlled rectifier can be switched on immediately in an ESD event.

The second main difference between the circuit 10 shown in FIG. 9 and the circuit 10 shown in FIG. 2 is that the circuit 10 shown in FIG. 9 is provided with a feedback stage. The feedback stage is operable to latch in a state of the field effect transistor 18 during an electrostatic discharge event. Accordingly, the feedback stage can provide feedback-enhanced triggering of the circuit 10. This can allow the size of the RC components used in the circuit 10 to be further reduced. This is because the detection of and holding during an ESD event can be decoupled: the holding function of the circuit can be provided by the feedback circuit so that the RC components, which therefore do not need to provide a holding function, can be tailored specifically for ESD event detection (whereby they can be made smaller).

The feedback stage in this example includes a p-channel field effect transistor 74 and an n-channel field effect transistor 72. The p-channel field effect transistor 74 and the n-channel field effect transistor 72 are connected in series between the first power rail 34 and the second power rail 36. The gates of the field effect transistors 72, 74 are connected to the gate of the field effect transistor 18 via node 76. The drains of the field effect transistors 72, 74 are connected to an input of one of the inverters of the chain of inverters. In the present example, the drains of the field effect transistors 72, 74 are connected to an input of the inverter 38B in the chain of inverters that is closest to the field effect transistor 18.

It is envisaged that a feedback stage of this kind may also be included in example embodiments of this disclosure that do not include a chain of inverters but instead include a single inverter (for instance the inverter 38 described above in relation to the circuit of FIGS. 2, 5 and 7). In such examples, the drains of the field effect transistors 72, 74 would be connected to the input of the single inverter 38 (for instance, the drains may be connected to the first node 50).

The operation of the feedback stage shown in FIG. 9 is as follows. During normal operation of the circuit 10 the voltage applied by the chain of inverters to the gate of the field effect transistor 18 is low. Since the gates of the field effect transistors 72, 74 are connected to the gate of the field effect transistor 18 through node 76, the p-channel field effect transistor 74 is switched on while the n-channel field effect transistor 72 is switched off. This connects the input of the inverter 38B to the first power rail 34 so that the voltage at the input of the inverter 38B is high, forming a feedback loop which keeps the output of the inverter 38B low for keeping the field effect transistor 18 switched off.

During an ESD event, the voltage at the gate of the field effect transistor 18 goes high as explained above, whereby the p-channel field effect transistor 74 is switched off and the n-field effect transistor 72 is switched on. This connects the input of the inverter 38B to the second power rail 36 so that the input of the inverter 38B is low. This causes the output of the inverter 38B to be held high for quickly turning on the field effect transistor 18 and for keeping the field effect transistor turned on during the ESD event. Subsequently (after a few RC times), the voltage at node 50 is raised through the capacitor 52. As a consequence, the voltage at node 76 goes low (the raised voltage at node 50 is applied to the input of the chain of inverters 38, 38A, 38B, whereby the output of the chain is low), switching off the field effect transistor 18 at the end of the ESD event. This approach can enhance the triggering of the field effect transistor 18 during an ESD event, and can allow the size of the RC components (for instance, the register 32 and the capacitor 52) to be further reduced, again saving space on a substrate upon which the circuit 10 may be located.

Accordingly, there has been described an electrostatic discharge power rail clamp circuit and an integrated circuit including the same. The power rail clamp circuit includes a first power rail, a second power rail and a first node. The circuit further includes an n-channel field effect transistor having a source and drain located in an isolated p-well in a semiconductor substrate. The drain is connected to the first power rail. The source and isolated p-well are connected to the first node. The circuit also includes a capacitor connected between the first node and the second power rail. The circuit further includes a resistor connected between the first power rail and the first node. The circuit also includes an inverter for controlling the gate of the field effect transistor, wherein the inverter has an input connected to the first node. The circuit further a silicon controlled rectifier connected between the first node and the second power rail.

Although particular embodiments of the present disclosure have been described, it will be appreciated that many modifications/additions and/or substitutions may be made within the scope of the claimed invention.

The invention claimed is:

1. An electrostatic discharge (ESD) power rail clamp circuit comprising:
   a first power rail;
   a second power rail;
   a first node;
   an n-channel field effect transistor comprising a source and drain located in an isolated p-well in a semiconductor substrate, wherein the drain is connected to the first power rail and wherein the source and the isolated p-well are connected to the first node;
   a capacitor connected between the first node and the second power rail;
   a resistor connected between the first power rail and the first node;
   an inverter for controlling the gate of the n-channel field effect transistor, wherein the inverter has an input connected to the first node; and
   a silicon controlled rectifier connected between the first node and the second power rail for discharging an ESD current flowing through the n-channel field effect transistor to the second power rail.

2. The circuit of claim 1, wherein the isolated p-well of the n-channel field effect transistor is isolated by one or more n-type regions in the semiconductor substrate.

3. The circuit of claim 2, wherein the one or more n-type regions are connected to the first power rail.

4. The circuit of claim 1, further comprising a diode string comprising a plurality of diodes connected between an output of the inverter and the first node.

5. The circuit of claim 1, further comprising a diode string comprising a plurality of diodes connected in series between the capacitor and the second power rail.

6. The circuit of claim 5, wherein an output of the silicon controlled rectifier is connected to a node of the circuit located between the capacitor and an input of the diode string.

7. The circuit of claim 1, wherein an output of the inverter is connected to the gate of the n-channel field effect transistor.

8. The circuit of claim 1, wherein the inverter is connected in series with a plurality of further inverters to form a chain of inverters, wherein an output of the chain of inverters is connected to the gate of the n-channel field effect transistor, and wherein the chain of inverters is also configured to supply control voltages to the silicon controlled rectifier.

9. The circuit of claim 1, further comprising a feedback stage for latching in a state of the gate of the n-channel field effect transistor during an electrostatic discharge event.

10. The circuit of claim 9, wherein the feedback stage comprises a p-channel field effect transistor and an n-channel field effect transistor connected in series between the first power rail and the second power rail.

11. The circuit of claim 10, wherein the gate of the n-channel field effect transistor is connected to the gates of the p-channel field effect transistor and the n-channel field effect transistor of the feedback stage, and wherein the feedback stage has an output for controlling the gate of the n-channel field effect transistor.

12. The circuit of claim 1, wherein during normal operation of the circuit, the drain, source and isolated p-well of the n-channel field effect transistor are all held at substantially the same voltage, wherein said voltage is the voltage of the first power rail.

13. The circuit of claim 1, wherein during an electrostatic discharge event, the capacitor is operable to pass an electrostatic discharge current to the second power rail, whereby the voltage at the first node is pulled down to the voltage of the second power rail.

14. The circuit of claim 1, wherein the second power rail is a ground rail.

15. An integrated circuit comprising
an electrostatic discharge (ESD) power rail clamp circuit comprising:
- a first power rail;
- a second power rail;
- a first node;
- an n-channel field effect transistor comprising a source and drain located in an isolated p-well in a semiconductor substrate, wherein the drain is connected to the first power rail and wherein the source and the isolated p-well are connected to the first node;
- a capacitor connected between the first node and the second power rail;
- a resistor connected between the first power rail and the first node;
- an inverter for controlling the gate of the n-channel field effect transistor, wherein the inverter has an input connected to the first node; and
- a silicon controlled rectifier connected between the first node and the second power rail for discharging an ESD current flowing through the n-channel field effect transistor to the second power rail.

* * * * *